United States Patent
Saito et al.

(10) Patent No.: US 12,444,635 B2
(45) Date of Patent: Oct. 14, 2025

(54) SUBSTRATE SUPPORT AND SUBSTRATE PROCESSING APPARATUS

(71) Applicant: Tokyo Electron Limited, Tokyo (JP)

(72) Inventors: Hideto Saito, Miyagi (JP); Makoto Kato, Miyagi (JP); Shin Yamaguchi, Miyagi (JP); Takashi Kanazawa, Miyagi (JP); Ryoma Muto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 129 days.

(21) Appl. No.: 17/846,605

(22) Filed: Jun. 22, 2022

(65) Prior Publication Data
US 2022/0415693 A1 Dec. 29, 2022

(30) Foreign Application Priority Data
Jun. 23, 2021 (JP) ................. 2021-103904

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32522* (2013.01); *H01L 21/67109* (2013.01)

(58) Field of Classification Search
CPC ........... H01L 21/6833; H01L 21/67109; H01L 21/67069; H01L 21/67103; H01L 21/67213; H01L 21/67253; H01L 21/68785; H01L 21/6831; H01L 21/68757; H01J 37/32522; H01J 37/32724; C23C 16/4581; C23C 16/4586

USPC .......................................................... 361/234
See application file for complete search history.

(56) References Cited

U.S. PATENT DOCUMENTS

| | | | | |
|---|---|---|---|---|
| 2003/0159307 | A1* | 8/2003 | Sago ................. | H01L 21/67017 34/107 |
| 2006/0076109 | A1* | 4/2006 | Holland ............ | H01L 21/67248 118/724 |
| 2011/0154843 | A1* | 6/2011 | Ko ....................... | H01L 21/6831 62/259.2 |
| 2014/0202386 | A1* | 7/2014 | Taga ......................... | C23C 4/08 118/500 |
| 2016/0198528 | A1* | 7/2016 | Kitagawa .......... | H01L 21/67109 156/345.52 |
| 2017/0309510 | A1* | 10/2017 | Maehata .................. | B23Q 3/15 |
| 2018/0053676 | A1* | 2/2018 | White ................. | H01L 21/6833 |

FOREIGN PATENT DOCUMENTS

| | | | |
|---|---|---|---|
| JP | 2003077996 A | * | 3/2003 |
| JP | 2007-266342 A | | 10/2007 |
| JP | 2016-27601 A | | 2/2016 |
| JP | 2017126641 A1 | | 7/2017 |
| JP | 2020-077761 A | | 5/2020 |
| JP | 2021-034413 A | | 3/2021 |
| WO | 2013147037 A1 | | 10/2013 |

* cited by examiner

*Primary Examiner* — Sreeya Sreevatsa
(74) *Attorney, Agent, or Firm* — Nath, Goldberg & Meyer; Jerald L. Meyer; Tanya E. Harkins (57) ABSTRACT

A substrate support includes an electrostatic chuck formed of ceramics and holding a substrate by electrostatic attraction, a base supporting the electrostatic chuck, and a flow path through which a heat exchange medium flows. An upper surface of the flow path is formed of ceramics.

14 Claims, 6 Drawing Sheets

SUBSTRATE SUPPORT AND SUBSTRATE PROCESSING APPARATUS

CROSS-REFERENCE TO RELATED APPLICATION

This application is based upon and claims the benefit of priority from Japanese Patent Application No. 2021-103904, filed on Jun. 23, 2021, the entire contents of which are incorporated herein by reference.

TECHNICAL FIELD

The present disclosure relates to a substrate support and a substrate processing apparatus.

BACKGROUND

For example, Patent Document 1 proposes a substrate processing apparatus having a substrate support on which a substrate to be processed is placed. The substrate support includes a base in which a flow path through which a temperature-controlled refrigerant flows, and an electrostatic chuck which includes an electrode in ceramics having high plasma resistance and a placement surface on which the substrate is placed, and has a configuration in which the base and the electrostatic chuck are bonded with an adhesive layer.

Prior Art Documents

Patent Document

Japanese laid-open publication No. 2016-27601

The substrate on the electrostatic chuck is cooled to a desired temperature by flowing the refrigerant, whose temperature is controlled by a chiller unit, through a flow path of the substrate support, but in recent years, radio frequency power applied to the substrate support is increasing. Therefore, heat input from plasma to the substrate increases, which may make the temperature control of the substrate insufficient.

SUMMARY

According to one embodiment of the present disclosure, there is provided a substrate support includes: an electrostatic chuck formed of ceramics and holding a substrate by electrostatic attraction; a base supporting the electrostatic chuck; and a flow path through which a heat exchange medium flows. An upper surface of the flow path is formed of ceramics.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to the drawings. Throughout the drawing, the same components may be denoted by the same reference numerals, and explanation thereof may not be repeated.

Plasma Processing System

Figure 1:
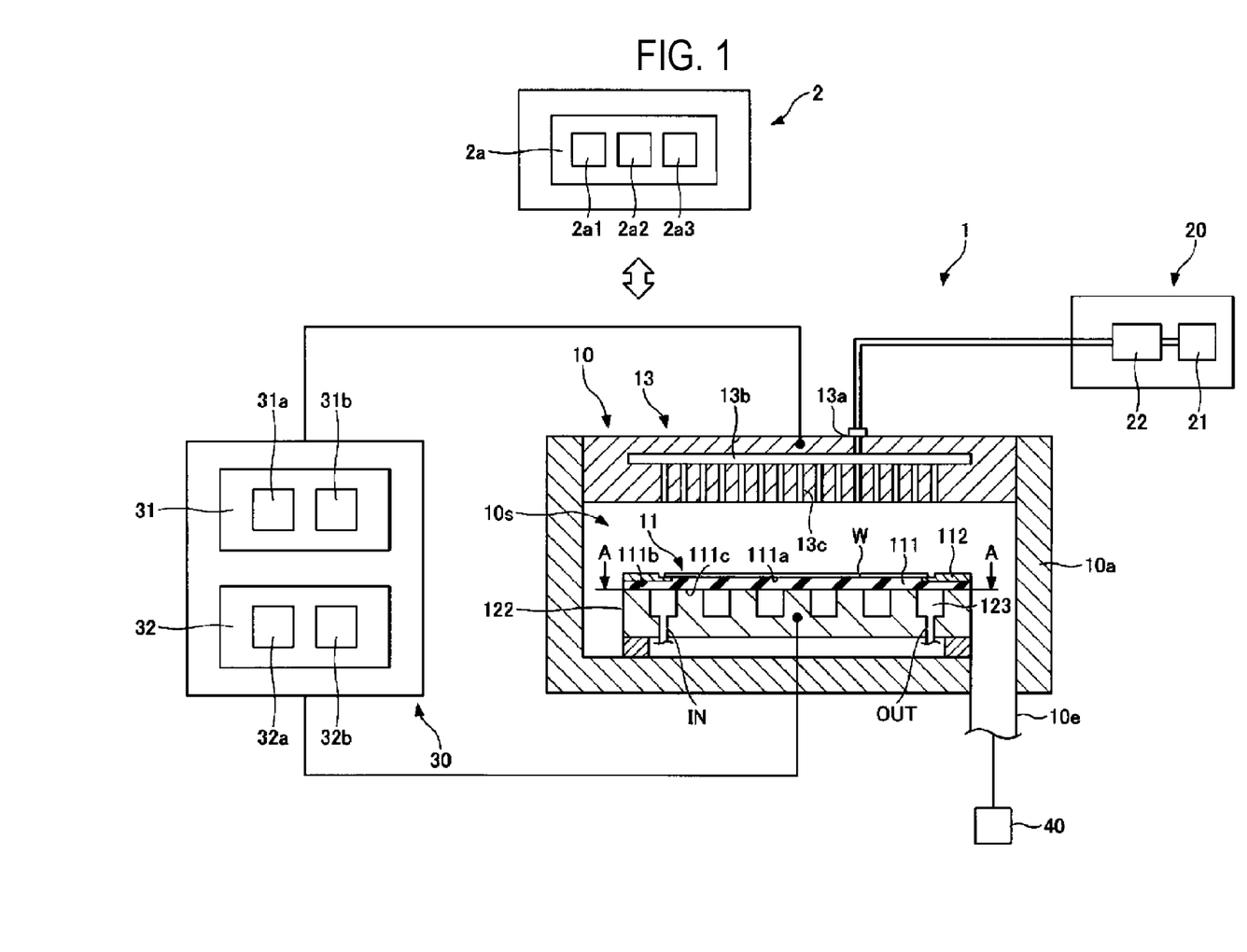
FIG. 1 is a schematic cross-sectional view showing an example of a substrate processing apparatus according to an embodiment.

An example of the configuration of a plasma processing system will be described below. The plasma processing system includes a capacitively-coupled plasma processing apparatus 1 and a controller 2. The plasma processing apparatus 1 is an example of a substrate processing apparatus. The capacitively-coupled plasma processing apparatus 1 includes a plasma processing chamber 10, a gas supply 20, a power supply 30, and an exhaust system 40. Further, the plasma processing apparatus 1 includes a substrate support 11 and a gas introduction part. The gas introduction part is configured to introduce at least one process gas into the plasma processing chamber 10. The gas introduction part includes a shower head 13. The substrate support 11 is arranged in the plasma processing chamber 10. The shower head 13 is arranged above the substrate support 11. In an embodiment, the shower head 13 constitutes at least a portion of the ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one process gas into the plasma processing space 10s, and at least one gas discharge port for discharging a gas from the plasma processing space. The sidewall 10a is grounded. The shower head 13 and the substrate support 11 are electrically isolated from the housing of the plasma processing chamber 10.

The substrate support 11 includes a base 122 and an electrostatic chuck 111. The substrate support 11 further includes a ring assembly 112. The electrostatic chuck 111 is arranged on the upper portion of the base 122 and has a central region (substrate support surface) 111a for supporting a substrate (wafer) to be processed (hereinafter referred to as a substrate W), and an annular region (ring support surface) 111b for supporting the ring assembly 112. The annular region 111b of the electrostatic chuck 111 surrounds the central region 111a of the electrostatic chuck 111 in a plan view. The substrate W is placed on the central region 111a of the electrostatic chuck 111, and the ring assembly 112 is placed on the annular region 111b of the electrostatic chuck 111 so as to surround the substrate W on the central region 111a of the electrostatic chuck 111. In an embodiment, the base 122 includes a conductive member. The conductive member of the base 122 functions as a lower electrode. The electrostatic chuck 111 is arranged on the base 122. The upper surface of the electrostatic chuck 111 has the substrate support surface 111a. The ring assembly 112 includes one or more annular members. At least one of the one or more annular members is an edge ring. Further, the substrate support 11 may include a temperature control module configured to adjust at least one of the electrostatic chuck 111, the ring assembly 112, and the substrate to a target temperature. The temperature control module may include a flow path 123, a heater, a heat transfer medium, or a combination thereof. In an embodiment, the flow path 123 is formed in the base 122, but the present disclosure is not limited thereto. A heat exchange medium flows through the flow path 123. The heat exchange medium is a liquid. Further, the substrate support 11 may include a heat transfer gas supply portion configured to supply a heat transfer gas between the lower surface of the substrate W and the substrate support surface 111a.

The shower head 13 is configured to introduce at least one process gas from the gas supply 20 into the plasma processing space 10s. The shower head 13 has at least one gas supply port 13a, at least one gas diffusion chamber 13b, and a plurality of gas introduction ports 13c. The process gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. In addition to the shower head 13, the gas introduction part may include one or more side gas injection portions (SGI: Side Gas Injector) attached to one or more openings formed in the sidewall 10a.

The gas supply 20 may include at least one gas source 21 and at least one flow rate controller 22. In an embodiment, the gas supply 20 is configured to supply at least one process gas from the corresponding gas source 21 to the shower head 13 via the corresponding flow rate controller 22. Each flow rate controller 22 may include, for example, a mass flow controller or a pressure-controlled flow rate controller. Further, the gas supply 20 may include at least one flow rate modulation device that modulates or pulses the flow rate of at least one process gas.

The power supply 30 includes an RF power supply 31 coupled to the plasma processing chamber 10 via at least one impedance matching circuit. The RF power supply 31 is configured to supply at least one RF signal (RF power) such as a source RF signal and a bias RF signal to the conductive member of the substrate support 11 and/or the conductive member of the shower head 13. As a result, plasma is formed from at least one process gas supplied into the plasma processing space 10s. Thus, the RF power supply 31 may function as at least a portion of a plasma generation part configured to generate plasma from one or more process gases in the plasma processing chamber 10. Further, by supplying the bias RF signal to the conductive member of the substrate support 11, a bias potential is generated in the substrate W, and the ion component in the formed plasma can be drawn into the substrate W.

In an embodiment, the RF power supply 31 includes a first RF generation part 31a and a second RF generation part 31b. The first RF generation part 31a is coupled to the conductive member of the substrate support 11 and/or the conductive member of the shower head 13 via at least one impedance matching circuit and is configured to generate a source RF signal (source RF power) for plasma generation. In an embodiment, the source RF signal has a frequency within a range of 13 MHz to 150 MHz. In an embodiment, the first RF generation part 31a may be configured to generate a plurality of source RF signals having different frequencies. The generated one or more source RF signals are supplied to the conductive member of the substrate support 11 and/or the conductive member of the shower head 13. The second RF generation part 31b is coupled to the conductive member of the substrate support 11 via at least one impedance matching circuit and is configured to generate a bias RF signal (bias RF power). In an embodiment, the bias RF signal has a lower frequency than the source RF signal. In an embodiment, the bias RF signal has a frequency within a range of 400 kHz to 13.56 MHz. In an embodiment, the second RF generation part 31b may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power supply 30 may include a DC power supply 32 coupled to the plasma processing chamber 10. The DC power supply 32 includes a first DC generation part 32a and a second DC generation part 32b. In an embodiment, the first DC generation part 32a is connected to the conductive member of the substrate support 11 and is configured to generate a first DC signal. The generated first bias DC signal is applied to the conductive member of the substrate support 11. In an embodiment, the first DC signal may be applied to another electrode such as an electrode in the electrostatic chuck. In an embodiment, the second DC generation part 32b is connected to the conductive member of the shower head 13 and is configured to generate a second DC signal. The generated second DC signal is applied to the conductive member of the shower head 13. In various embodiments, at least one of the first and second DC signals may be pulsed. Further, the first and second DC generation parts 32a and 32b may be provided in addition to the RF power supply 31, or the first DC generation part 32a may be provided in place of the second RF generation part 31b.

The exhaust system 40 may be connected to, for example, a gas discharge port 10e provided at the bottom of the plasma processing chamber 10. The exhaust system 40 may include a pressure regulating valve and a vacuum pump. The pressure regulating valve regulates the internal pressure of the plasma processing space 10s. The vacuum pump may include a turbo molecular pump, a dry pump, or a combination thereof.

The controller 2 processes computer-executable instructions that cause the plasma processing apparatus 1 to perform various steps to be described in the present disclosure. The controller 2 may be configured to control each element of the plasma processing apparatus 1 to perform the various steps to be described herein. In an embodiment, a part or all of the controller 2 may be included in the plasma processing apparatus 1. The controller 2 may include, for example, a computer 2a. The computer 2a may include, for example, a processing part (CPU: Central Processing Unit) 2a1, a storage part 2a2, and a communication interface 2a3. The processing part 2a1 may be configured to perform various control operations based on a program stored in the storage part 2a2. The storage part 2a2 may include a RAM (Random Access Memory), a ROM (Read Only Memory), a HDD (Hard Disk Drive), a SSD (Solid State Drive), or a combination thereof. The communication interface 2a3 may communicate with the plasma processing apparatus 1 via a communication line such as a LAN (Local Area Network).

Substrate Support

Figure 2:
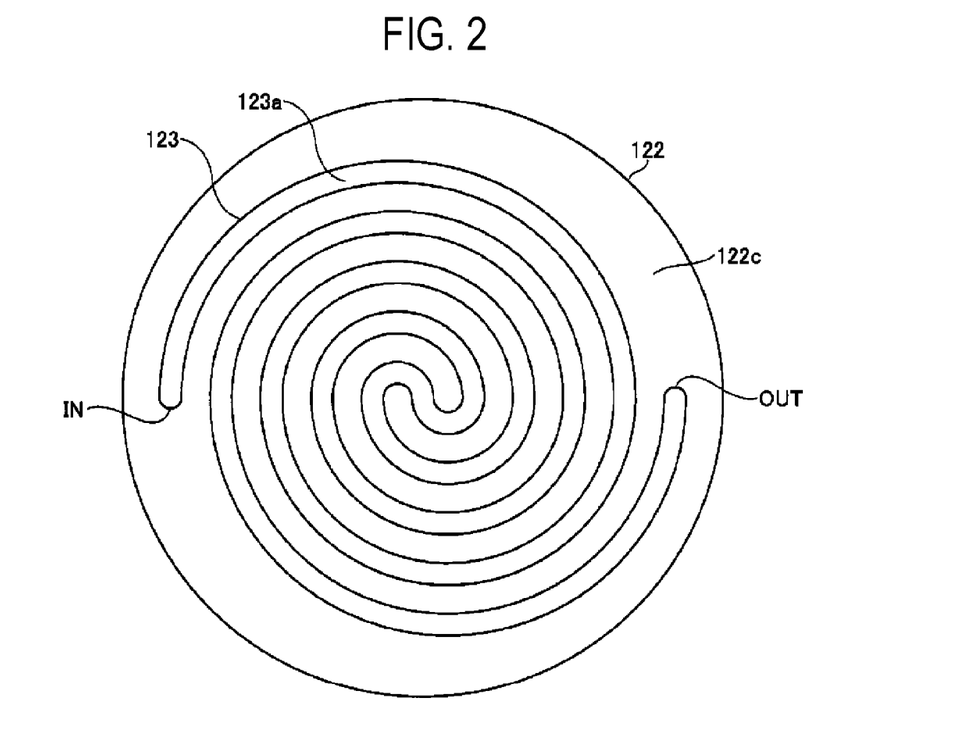
FIG. 2 is a view showing an example of a flow path according to an embodiment.

The flow path 123 formed in the substrate support 11 will be further described with reference to FIG. 2. FIG. 2 is a view of the flow path 123 viewed from the A-A plane in FIG. 1 and is a plane view of the base 122 viewed from above. In FIG. 2, the upper surface 122c of the base 122 is shown in a disc shape. The flow path 123 is formed in the base 122 and is opened to the electrostatic chuck 111 side at the upper surface 122c of the base 122. That is, the flow path 123 is formed in a spiral shape in the base 122 and has an opening 123a that is opened in a spiral shape on the upper surface. As a result, the temperature of the substrate W can be controlled in the entire region of the substrate support surface 111a (see FIG. 1) of the substrate support 11. The shape of the flow path 123 is not limited to the spiral shape, but may be a radial shape or the like.

Figure 3A:
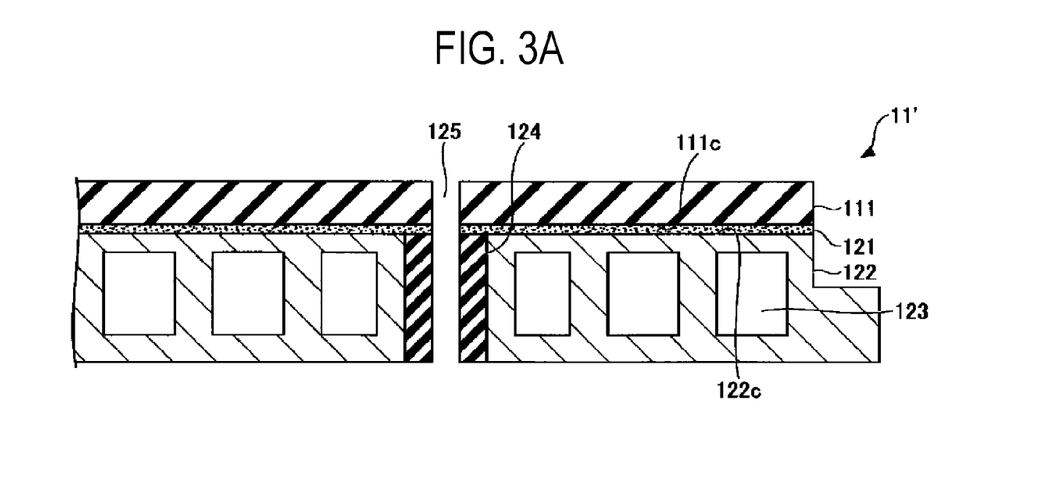
FIG. 3A is a view showing an example of the configuration of a substrate support according to a comparative example and FIG. 3B is a view showing an example of the configuration of a substrate support according to an embodiment.
Figure 3B:
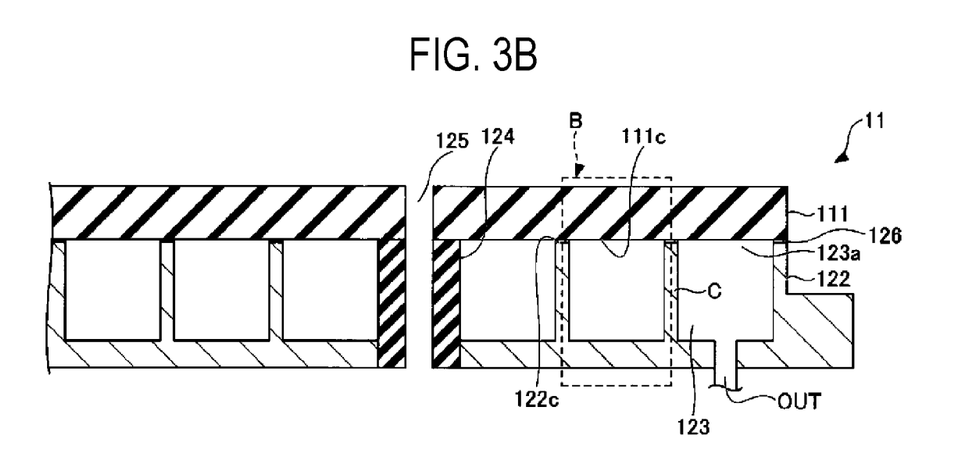

The configuration of the substrate support 11 will be further described with reference to FIGS. 3A and 3B. FIG. 3A is a view showing an example of the configuration of a substrate support 11' according to a comparative example, and FIG. 3B is a view showing an example of the configuration of the substrate support 11 according to an embodiment. In both of FIGS. 3A and 3B, the configurations of the right halves of the substrate support 11' and the substrate support 11 are shown by enlargement, and the configuration of the left half thereof is omitted.

In the substrate support 11' according to the comparative example of FIG. 3A, an adhesive layer 121 is interposed between the base 122 and the electrostatic chuck 111. The adhesive layer 121 is formed of resin. In the substrate support 11' according to the comparative example, the adhesive layer 121 is a liquid or a sheet-like resin. Therefore, since the base 122 and the electrostatic chuck 111 cannot be bonded in a small area close to a point or a line, the substrate support 11' has a configuration in which the upper surface 122c of the base 122 and the lower surface 111c of the electrostatic chuck 111 are entirely bonded by the adhesive layer 121.

In such a configuration, thermal resistance in the adhesive layer, thermal resistance at the boundary surface between the base 122 and the adhesive layer 121, and thermal resistance at the boundary surface between the adhesive layer 121 and the electrostatic chuck 111 are generated. Due to these thermal resistances, the cooling efficiency of the electrostatic chuck 111 due to a refrigerant flowing through the flow path 123 deteriorates, so that the temperature of the electrostatic chuck 111 may not be efficiently lowered.

In contrast, in the substrate support 11 according to the embodiment of FIG. 3B, there is no adhesive layer between the base 122 and the electrostatic chuck 111. In such a configuration, there is no thermal resistance in the adhesive layer. Moreover, since the boundary surface between the base 122 and the electrostatic chuck 111 becomes a surface excluding portions corresponding to the opening 123a, the area of the boundary surface is smaller than the boundary surface of the comparative example. Therefore, the thermal resistance at the boundary surface between the base 122 and the electrostatic chuck 111 can be reduced, so that the heat insulating effect can be reduced. As a result, the cooling efficiency of the electrostatic chuck 111 by the refrigerant flowing through the flow path 123 can be improved. Further, since the adhesive layer does not exist, it is possible to eliminate the causes that deteriorate in-plane uniformity of the temperature of the substrate W due to, e.g., the film thickness of the adhesive layer. As a result, the temperature control efficiency of the electrostatic chuck 111 can be increased, and the temperature distribution of the substrate W can be made uniform.

As a result, since the temperature of the substrate W can be uniformly and sufficiently lowered, it is possible to input larger RF power. As a result, the etching rate at the time of processing the substrate W can be increased. When the magnitude of the input RF power is to be maintained, the cooling capacity of a chiller unit which supplies a refrigerant may be made smaller by an amount that the cooling efficiency of the substrate W is increased after the adhesive layer is eliminated. As a result, the size of the chiller unit can be reduced and the footprint can be reduced accordingly. In the above, the cooling of the substrate W by the refrigerant has been described. However, in the temperature adjustment of the substrate W by the heat exchange medium using the refrigerant and the heating medium as an example, including the heating of the substrate W as well as the cooling, the temperature control efficiency of the substrate support 11 can be increased.

Hereinafter, a configuration example of the substrate support 11 will be described in the order of a substrate support 11 according to a first embodiment, a substrate support 11 according to a second embodiment, and a substrate support 11 according to a third embodiment. The substrate support 11 according to any of the embodiments does not have an adhesive layer and can increase the temperature control efficiency.

First Embodiment

Figure 4:
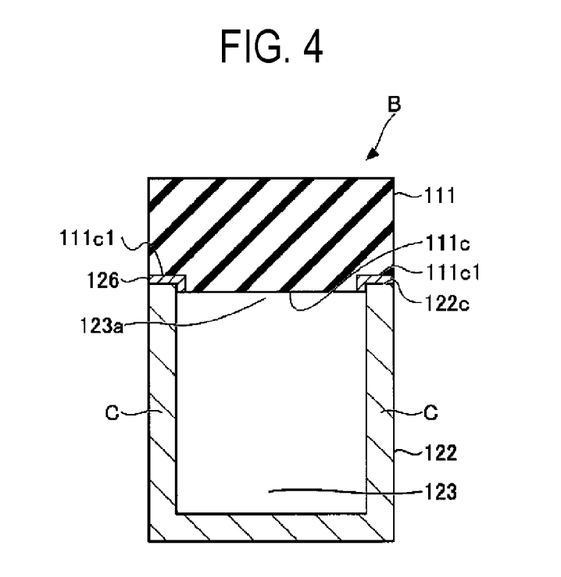
FIG. 4 is an enlarged view of a region B in FIG. 3B.
Figure 5A:
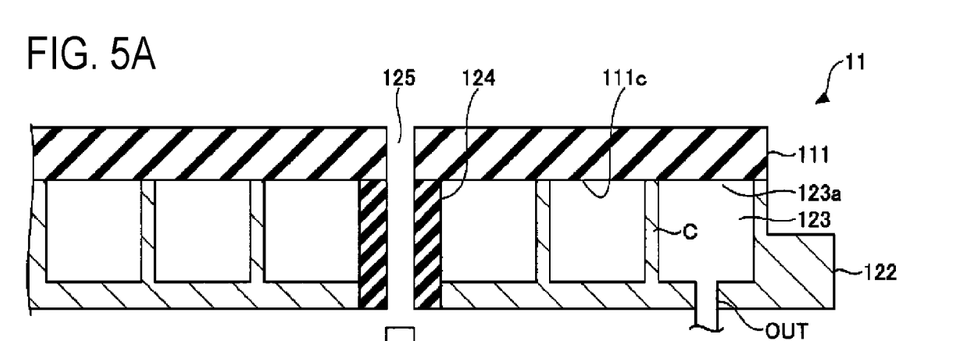
FIGS. 5A and 5B are views showing an example of deformation absorption due to a temperature change of the substrate support according to an embodiment.
Figure 5B:
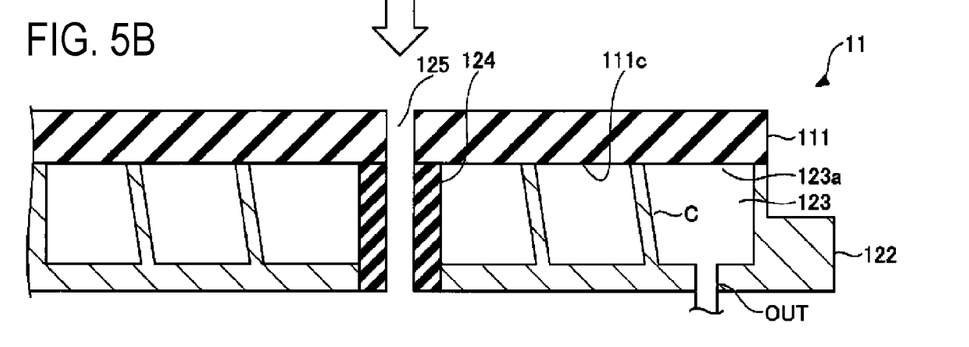

First, the configuration example of the substrate support 11 according to the first embodiment will be described with reference to FIGS. 4 to 6A and 6B in addition to FIG. 3B. FIG. 4 is an enlarged view of a B region in FIG. 3B showing the substrate support 11 according to the first embodiment. FIGS. 5A and 5B are views showing an example of deformation absorption due to a temperature change of the substrate support 11 according to the embodiment. FIG. 6B is an enlarged view of a portion (the B region in FIG. 3B) of the substrate support 11 according to the first embodiment, in comparison with the configuration of the substrate support 11' according to the comparative example of FIG. 6A. In addition, in FIGS. 5A, 5B and 6B, the illustration of a bonding portion between the base 122 and the electrostatic chuck 111 by metal brazing is omitted.

As shown in FIG. 3B, the substrate support 11 according to the first embodiment has a structure having an electrostatic chuck 111 and a base 122 and having no resin adhesive layer. The electrostatic chuck 111 holds the substrate W by electrostatic attraction. The base 122 is provided below the electrostatic chuck 111 and supports the electrostatic chuck 111.

The base 122 and the electrostatic chuck 111 are made of different materials. The base 122 is formed of metal such as aluminum, and the electrostatic chuck 111 is formed of ceramics such as alumina ($Al_2O_3$). In the substrate support 11 according to the first embodiment, aluminum of the base 122 and ceramics of the electrostatic chuck 111 are directly bonded.

The base 122 has a flow path 123 through which a heat exchange medium flows. The flow path 123 is formed in the base 122 and has an opening 123a that is opened to the electrostatic chuck 111 side. There is no adhesive layer between the base 122 and the electrostatic chuck 111. With this configuration, the upper surface of the flow path 123 is formed of ceramics of the electrostatic chuck 111.

The lower surface 111c of the electrostatic chuck 111 is formed in a disc shape. The upper surface 122c of the base 122 is formed in a disc shape having the same diameter as the lower surface 111c of the electrostatic chuck 111. The opening 123a of the flow path 123 is formed on the upper surface 122c of the base 122 and is opened to the electrostatic chuck 111 side. Therefore, the upper surface 122c of the base 122 other than the opening 123a of the flow path 123 and the lower surface 111c of the electrostatic chuck 111 are bonded by brazing of metal 126.

As shown in FIG. 3A, the substrate support 11' according to the comparative example has the adhesive layer 121. The adhesive layer 121 is formed of a liquid or a sheet-like resin and adheres the electrostatic chuck 111 and the base 122 on a surface. That is, in the substrate support 11' according to the comparative example, the lower surface 111c of the electrostatic chuck 111 and the upper surface 122c of the base 122 are adhered to almost the entire surface.

In contrast, in the substrate support 11 according to the present embodiment, the upper surface 122c of the base 122 and the lower surface 111c of the electrostatic chuck 111 are bonded by brazing of metal 126. In the substrate support 11 according to the present embodiment, the electrostatic chuck 111 can be sufficiently bonded to the base 122 even though the bonding area between the base 122 and the electrostatic chuck 111 is small by brazing of metal 126. Therefore, a partition wall C of the base 122 shown in FIG. 3B may have a width of 2 to 20 mm or a width of 1 to 2 mm. By bonding the upper surface 122c of the partition wall C and the lower surface 111c of the electrostatic chuck 111 by brazing of metal 126, the opening 123a of the flow path 123 is closed by the lower surface 111c of the electrostatic chuck 111, so that the refrigerant is prevented from leaking from the flow path 123. With this configuration, in the substrate support 11 according to the present embodiment, the upper surface of the flow path 123 is formed of ceramics of the electrostatic chuck 111.

Referring to FIGS. 1 and 2 in addition to FIGS. 3A and 3B, an introduction flow path IN and a discharge flow path OUT are connected to the flow path 123 from the lower surface side of the base 122. The introduction flow path IN introduces the refrigerant into the flow path 123, and the discharge flow path OUT discharges the refrigerant flowing through the flow path 123. The introduction flow path IN extends from the lower surface side of the base 122, for example, so that the extension direction of the introduction flow path IN is orthogonal to the flow direction of the refrigerant flowing through the flow path 123, and is connected to the flow path 123. Further, the discharge flow path OUT extends from the lower surface side of the base 122, for example, so that the extension direction of the discharge flow path OUT is orthogonal to the flow direction of the refrigerant flowing through the flow path 123, and is connected to the flow path 123. In this way, the substrate support 11 is configured to be able to control the temperature of the substrate support 11 by allowing the refrigerant to flow through the flow path 123 of the base 122.

Further, as shown in FIG. 3B, a gas flow path 125 for a heat transfer gas is formed in the substrate support 11, so that the heat transfer gas such as a helium (He) gas is supplied from the gas flow path 125 to the back surface of the substrate W. The gas flow path 125 is formed by communicating a through-hole penetrating through the internal space of a sleeve 124, which is provided on the base 122, and the electrostatic chuck 111.

Example of Bonding Method

Next, an example of a bonding method will be described with reference to FIG. 4 which is an enlarged view of the B region in FIG. 3B. In the substrate support 11 according to the first embodiment, the upper surface 122c of the base 122 (that is, the upper surface 122c of the partition wall C between flow paths 123) is bonded to the lower surface 111c of the electrostatic chuck 111. As shown in FIG. 4, a spot spacing portion 111c1 is formed on the lower surface 111c of the electrostatic chuck 111 at a position corresponding to the upper surface 122c of the partition wall C. If the spot spacing portion 111c1, which is formed of ceramics, and metal such as aluminum are directly bonded by brazing, a bonding defect is likely to occur. Therefore, it is preferable to metallize the ceramics portion of the spot spacing portion 111c1 with a thin metal film before brazing the metal.

After metallizing, the upper surface 122c of the partition wall C is inserted into the spot spacing portion 111c1, and the spot spacing portion 111c1 and the upper surface 122c of the partition wall C are bonded by brazing with the metal 126 such as aluminum. Metal brazing is more plasma-resistant and liquid leak-resistant than an adhesive. Therefore, this makes it possible to manufacture the substrate support 11 in which there is no separation between the electrostatic chuck 111 and the base 122 and there is no liquid-leakage from the flow path 123. However, the bonding method between the partition wall C of the base 122 and the electrostatic chuck 111 is not limited to the metal brazing, and other bonding methods may be used.

As another bonding method, the electrostatic chuck 111 and the base 122 may be bonded by sintering (for example, inorganic sintering) instead of the metal brazing. The inorganic sintering is a method in which a silica-based sintering auxiliary agent is applied to the electrostatic chuck 111 and the base 122 and is re-sintered with a hot press or the like. As a result, it is possible to bond the electrostatic chuck 111 and the base 122 without any boundary surface in an external appearance. Therefore, the interfacial thermal resistance can be reduced.

In the case of the substrate support 11' of the comparative example shown in FIG. 3A, when the substrate support 11' is heated to a high temperature due to heat input from plasma or the like and the electrostatic chuck 111 and the base 122 are thermally expanded, a difference in thermal expansion between the electrostatic chuck 111 and the base 122 is absorbed by the resin adhesive layer 121.

In contrast, in the substrate support 11 according to the present embodiment without an adhesive layer, as shown in FIG. 5B, the partition wall C between the flow paths 123 is made as thin as possible to 1 to 2 mm. As a result, when the substrate support 11 is heated to a high temperature and the electrostatic chuck 111 and the base 122 are thermally expanded, the difference in thermal expansion between the electrostatic chuck 111 and the base 122 is absorbed by the flow path 123 itself being deformed, as shown in FIG. 5A which shows a state before the thermal expansion and FIG. 5B which shows a state after the thermal expansion. At this time, a pressure of the refrigerant flowing through the flow path 123 is much smaller than a force deformed by the difference in thermal expansion between the electrostatic chuck 111 and the base 122. Therefore, when the thickness of the partition wall C is 1 to 2 mm, the refrigerant can flow into the flow path 123 while allowing the flow path 123 to be deformed.

In the above, the case where the substrate support 11 is heated to the high temperature due to the heat input from plasma or the like has been described. However, without being limited thereto, a difference in thermal expansion between the electrostatic chuck 111 and the base 122 caused by cooling by flowing the refrigerant from the chiller unit can also be absorbed by the deformation of the flow path 123 (the partition wall C).

As described above, according to the substrate support 11 according to the first embodiment, by eliminating the adhesive layer, the thermal resistance at the boundary surface between the electrostatic chuck 111 and the base 122 can be lowered to increase the temperature control efficiency of the substrate support 11 such as improving the cooling efficiency by the refrigerant.

There is a concern that the bonding surface between the electrostatic chuck 111 and the base 122 may be easily peeled off by eliminating the adhesive layer as a cushioning material that absorbs the difference in thermal expansion between the electrostatic chuck 111 and the base 122. In order to avoid this, the area of the bonding surface between the electrostatic chuck 111 and the base 122 is minimized to eliminate the peeling. That is, according to the substrate support 11 according to the first embodiment, the flow path 123 formed in the base 122 is not buried in the base 122 and the upper surface of the flow path 123 has the opening 123a that is opened to the electrostatic chuck 111 side. Therefore, the bonding surface between the electrostatic chuck 111 and the base 122 is limited to the upper surface of the partition wall C. By forming the partition wall C to a thickness of 1 to 2 mm, the area of the bonding surface between the electrostatic chuck 111 and the base 122 is reduced, thereby eliminating the separation between the electrostatic chuck 111 and the base 122.

Further, the difference in thermal expansion between the electrostatic chuck 111 of ceramics and the base 122 of aluminum can be absorbed by the deformation of the flow path 123 (the partition wall C). This makes it possible to eliminate the separation between the electrostatic chuck 111 and the base 122 even when the substrate support 11 is controlled to a high temperature or a low temperature.

Figure 6A:
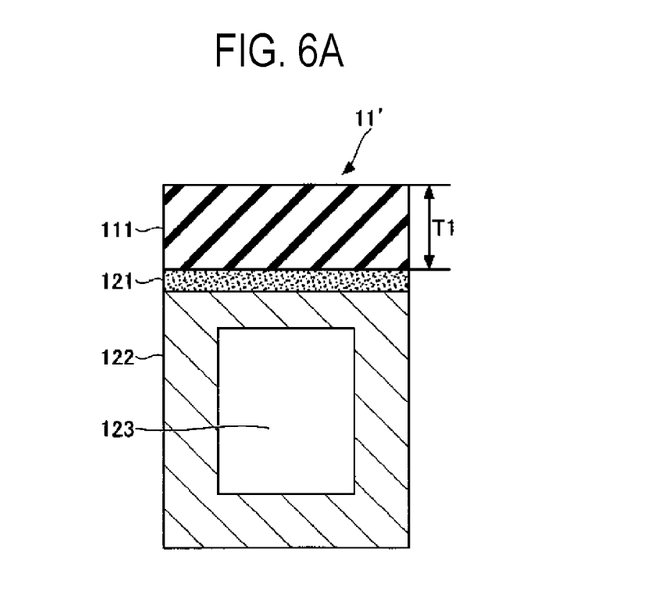
FIG. 6A is an enlarged view of a portion of the substrate support according to a comparative example and FIG. 6B is an enlarged view of a portion of the substrate support according to the embodiment.
Figure 6B:
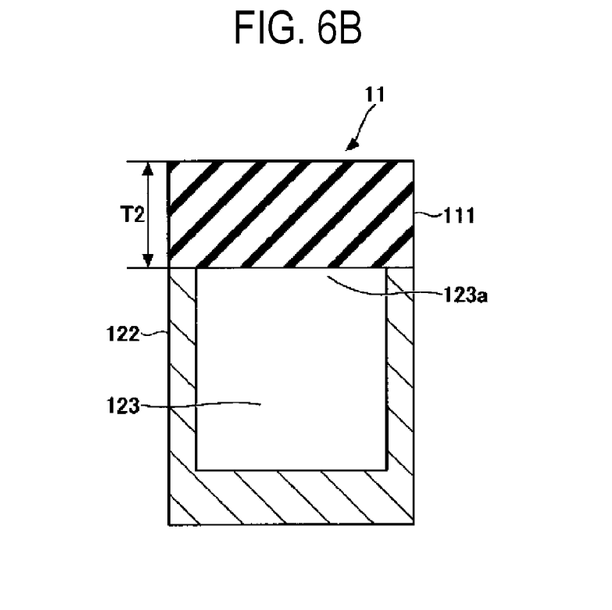

Further, in the substrate support 11 according to the first embodiment shown in FIG. 6B, the thickness T2 (<T1) of the electrostatic chuck 111 can be increased by the thickness of the adhesive layer 121 of the substrate support 11' according to the comparative example shown in FIG. 6A. As a result, a heat diffusion layer can be secured. For example, in the case of the spiral flow path 123 of FIG. 2, since the upper part of the flow path 123 is easily cooled, the cooling efficiency is higher in the central region of the electrostatic chuck 111 than in the outer peripheral region thereof. However, by increasing the thickness of the electrostatic chuck 111, heat is easily diffused from the central region of ceramics forming the electrostatic chuck 111 to the outer peripheral side thereof. As a result, the temperature in-plane uniformity on the substrate support surface 111a on which the substrate W is placed can be achieved. As a result, in-plane uniformity of the temperature of the substrate W can be achieved.

Further, in the substrate support 11 according to the first embodiment, the partition wall C is thinned to about 1 to 2 mm in order to enable the deformation of the flow path 123. The thickness of the electrostatic chuck 111 bonded to the upper surface of the partition wall C may be equal to or thinner than that of the comparative example shown in FIG. 6A.

Further, in the substrate support 11 according to the first embodiment, as the material of the base 122, a metal ceramics-containing material (MMC: Metal Matrix Composite) or a low line expansion material may be used instead of the metal material such as aluminum. When the low line expansion material of metal is used for the base 122, it is possible to metallize and bond the low line expansion material of metal. When the low line expansion material of ceramics or the metal ceramics-containing material is used for the base 122, it is possible to bond it by using sintering without metallizing. Since the ceramic material is difficult to be metal-brazed, it is metallized and then brazed with metal, or is sintered between ceramics.

Figure 7A:
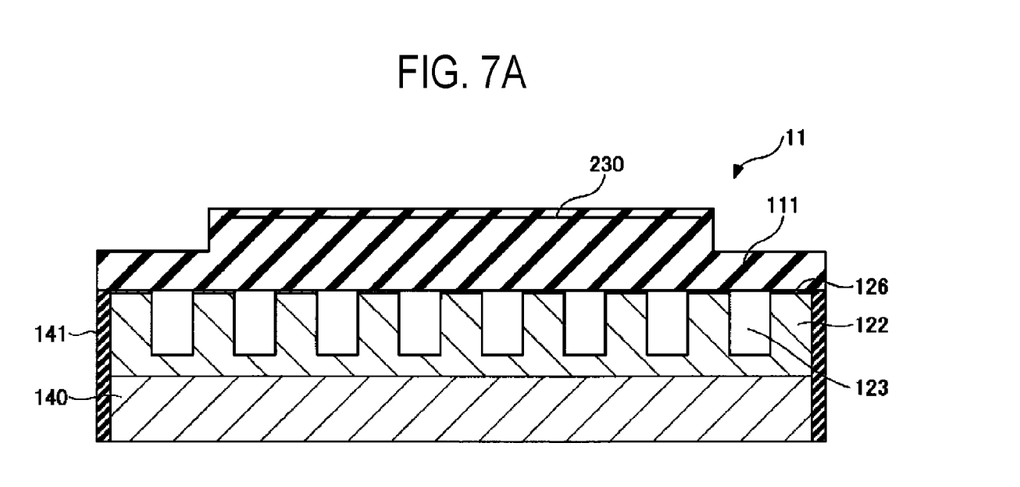
FIG. 7A is a view showing an example of the configuration of a substrate support according to a first embodiment.

A metal plate 140 may be further provided below the base 122 of FIG. 7A. The outer peripheral surfaces of the base 122 and the metal plate 140 may be covered with a protective film 141 by thermal spraying of yttria ($Y_2O_3$). As a result, plasma resistance of the substrate support 11 can be further increased.

Although not shown in FIGS. 1 to 6B, an attraction electrode 230 that applies a DC voltage for electrostatically attracting the substrate is buried in the electrostatic chuck 111 of the substrate support 11 according to the first embodiment. An attraction electrode 230 and an RF electrode 231 to which RF power is applied are buried in an electrostatic chuck 111 of a substrate support 11 according to a second embodiment of FIG. 7B and an electrostatic chuck 111 of a substrate support 11 according to a third embodiment of FIG. 7C, both of which will be described below. In the substrate support 11 according to the first embodiment, RF power is applied to the base 122. However, even in the substrate support 11 according to the first embodiment, the RF electrode 231 may also be buried in the electrostatic chuck 111.

Second Embodiment

Figure 7B:
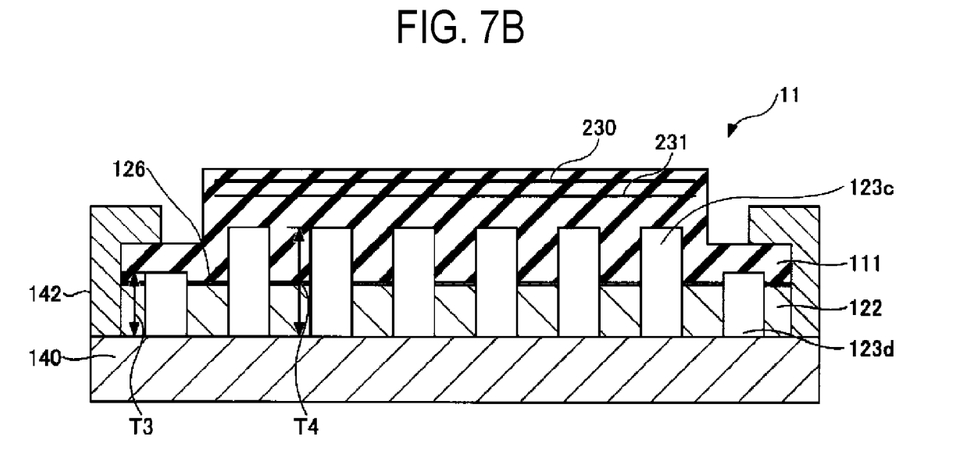
FIG. 7B is a view showing an example of the configuration of a substrate support according to a second embodiment.

Next, a configuration example of the substrate support 11 according to the second embodiment will be described with reference to FIG. 7B. FIG. 7B shows an example of the configuration of the substrate support 11 according to the second embodiment. In the substrate support 11 according to the second embodiment, a flow path 123c is formed at least in the electrostatic chuck 111. The flow path 123c is opened to the lower surface of the electrostatic chuck 111 toward the base 122.

In the example of FIG. 7B, the base 122 is formed of a conductive material such as aluminum. In this example, a flow path 123d is also formed on the base 122 side at a position facing the flow path 123c of the electrostatic chuck 111. The flow path 123c is opened to the upper surface 122c of the base 122 as in the substrate support 11 according to the first embodiment. However, the flow path 123d of the base 122 may or may not be formed.

The electrostatic chuck 111 is arranged on the base 122, the openings of the flow path 123c and the flow path 123d are combined to communicate with each other, and the partition wall of the electrostatic chuck 111 and the partition wall of the base 122 are brazed and bonded with metal 126. A flow path formed by combining the flow path 123c and the flow path 123d is also referred to as a flow path 123. With this configuration, the upper surface of the flow path 123 is formed of ceramics.

The height of the flow path 123 may be changed according to a step of the outer periphery provided on the electrostatic chuck 111. For example, the height T4 of the flow path 123 in the central region of the electrostatic chuck 111 may be formed to be higher than the height T3 of the flow path 123 in the outer peripheral region of the electrostatic chuck 111.

As described above, in the substrate support 11 according to the second embodiment, the base 122 and the electrostatic chuck 111 have different materials, and the flow path 123 is formed at least in the electrostatic chuck 111 and is opened to the base 122 side. The flow path 123 is formed at corresponding positions of the electrostatic chuck 111 and the base 122 so as to communicate with each other. The base 122 other than the opening of the flow path 123 and the electrostatic chuck 111 are bonded by metal brazing or sintering.

According to this, by eliminating the adhesive layer, the thermal resistance at the boundary surface between the electrostatic chuck 111 and the base 122 can be lowered to increase the temperature control efficiency of the substrate support 11 such as improving the cooling efficiency by the refrigerant.

Further, by forming the base 122 with a metal ceramics-containing material (MMC) or a conductive material having higher workability than a low line expansion material, it is possible to reduce the difficulty in manufacturing and it is also possible to reduce cracks of the electrostatic chuck 111 or the base 122 at the time of bonding such as firing. Alumina or the like can be used for a ceramics plate of the electrostatic chuck 111.

Further, even though the thickness of the electrostatic chuck 111 is not increased, the height of the entire flow path 123 can be increased by providing the flow path 123c on the electrostatic chuck 111 side. As a result, since the sectional area of the flow path 123 becomes large, a pressure loss becomes small, so that the cooling efficiency by the refrigerant and the temperature control efficiency of the substrate support 11 can be increased.

Further, in the substrate support 11 according to the second embodiment, the outer peripheries of the base 122 and the electrostatic chuck 111 is fixed by a clamp 142. This can prevent leakage of the refrigerant from the flow path 123 by adding a structure in which the base 122 and the electrostatic chuck 111 are gripped by the clamp 142 from the outer periphery side even if the flow path 123 cannot be formed to have a sealability in the substrate support 11 during manufacturing. Further, by combining the clamp 142 with the bonding such as metal brazing, it is possible to facilitate the manufacture or reduce the cost by reducing the bonding surface by metal brazing or the like.

Also in the second embodiment, the thickness of the partition wall of the flow path 123 is 1 to 2 mm, and the flow path 123 can be deformed. Further, the heat exchange medium such as the refrigerant flowing through the flow path 123 is a liquid.

Third Embodiment

Figure 7C:
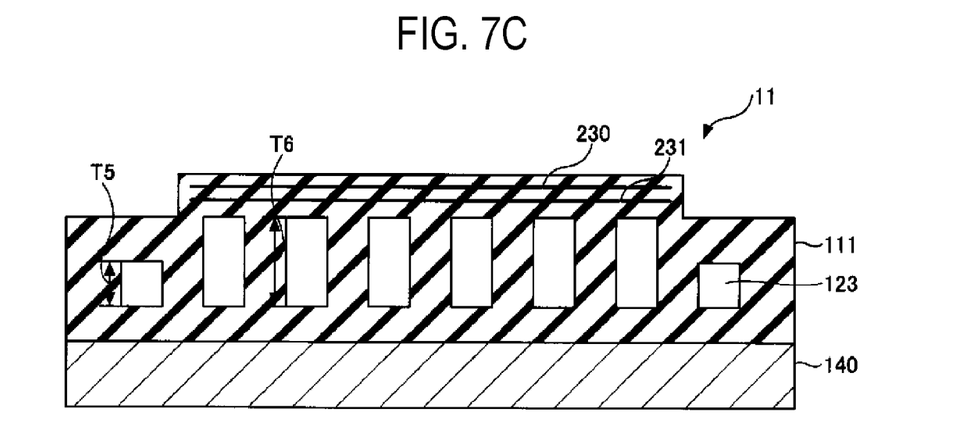
FIG. 7C is a view showing an example of the configuration of a substrate support according to a third embodiment.

Next, a configuration example of the substrate support 11 according to the third embodiment will be described with reference to FIG. 7C. FIG. 7C shows an example of the configuration of the substrate support 11 according to the third embodiment. In the substrate support 11 according to the third embodiment, the base 122 and the electrostatic chuck 111 are made of the same material and integrally formed, and are configured as a ceramics plate having an integrated structure. Hereinafter, the ceramics plate having the integrated structure is also referred to as an electrostatic chuck 111. The electrostatic chuck 111 of the ceramics plate is formed of, for example, alumina. With this configuration, the upper surface of the flow path 123 is formed of ceramics.

The electrostatic chuck 111 of the ceramics plate having the integrated structure has an internal flow path 123. The height of the flow path 123 may be changed according to a step of the outer periphery of the electrostatic chuck 111. For example, the height T6 of the flow path 123 in the central region of the electrostatic chuck 111 may be formed to be higher than the height T5 of the flow path 123 in the outer peripheral region. Since the sectional area of the flow path 123 becomes large by increasing the height of the flow path 123 inside the electrostatic chuck 111, a pressure loss becomes small, so that the cooling efficiency by the refrigerant can be increased.

As a method of forming the internal flow path 123 to manufacture the electrostatic chuck 111, a laminated molding manufacturing method such as a green sheet or a roll compaction (RC manufacturing method) can be used. By combining the laminated molding manufacturing method and the printing of electrodes (attraction electrode and RF electrode), the electrostatic chuck 111 can be manufactured by integrally molding and firing.

Also in the third embodiment, the thickness of the partition wall of the flow path 123 is 1 to 2 mm, and the flow path 123 can be deformed. Further, the heat exchange medium such as the refrigerant flowing through the flow path 123 is a liquid.

As described above, in the substrate support 11 according to the third embodiment, the base 122 and the electrostatic chuck 111 are made of the same material and are integrally formed. According to this, by forming the electrostatic chuck 111 without the boundary surface between the electrostatic chuck 111 and the base 122, the thermal resistance can be reduced, so that the cooling efficiency by the refrigerant can be increased.

In addition, insulators are no longer required, and costs can be reduced by the RC manufacturing method or the like.

The substrate supports 11 according to the first to third embodiments have been described above. In the substrate support 11 according to any of the embodiments, the adhesive layer can be eliminated, the thermal resistance can be lowered, so that the temperature control efficiency of the substrate W can be increased. Further, since the substrate support 11 has no adhesive layer, an O-ring or the like for suppressing the consumption of an adhesive layer due to plasma or the like becomes unnecessary.

Further, also in the substrate support 11 according to the first embodiment, the bonding by sintering is possible instead of the bonding by metal brazing. However, it may be necessary to select the materials of the electrostatic chuck 111 and the base 122 that can withstand the sintering.

Further, also in the substrate supports 11 according to the first and third embodiments, the clamp 142 may be used in the same manner as the substrate support 11 according to the second embodiment. Further, if the flow path 123 can be manufactured into a sealed form in the inorganic bonding in the substrate support 11 according to the second embodiment, the clamp 142 may not be used.

The substrate support and the substrate processing apparatus according to the embodiments disclosed herein should be considered to be exemplary and not restrictive in all respects. The embodiments can be modified and improved in various forms without departing from the appended claims and the gist thereof. The matters described in the plurality of embodiments may have other configurations unless contradictory, and may be combined unless contradictory.

The substrate processing apparatus of the present disclosure is applicable to any types of apparatuses including an Atomic Layer Deposition (ALD) apparatus, Capacitively-Coupled Plasma (CCP), Inductively-Coupled Plasma (ICP), Radial Line Slot Antenna (RLSA), Electron Cyclotron Resonance Plasma (ECR), and Helicon Wave Plasma (HWP).

Further, although the plasma processing apparatus has been described as an example of the substrate processing apparatus, the substrate processing apparatus is not limited to the plasma processing apparatus and may be any apparatus as long as it is an apparatus that performs a predetermined process (for example, a film-forming process, an etching process, etc.) on a substrate. For example, the substrate processing apparatus may be a thermal ALD apparatus, a plasma ALD apparatus, a thermal CVD (Chemical Vapor Deposition) apparatus, a plasma CVD apparatus, or the like.

According to the present disclosure in some embodiments, it is possible to increase the temperature control efficiency of a substrate support.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate support comprising:
an electrostatic chuck formed of ceramics and holding a substrate by electrostatic attraction;
a base supporting the electrostatic chuck; and
a flow path through which a heat exchange medium flows, the flow path being formed in the base,
wherein an upper surface of the flow path is formed of ceramics forming the electrostatic chuck, and
wherein the electrostatic chuck includes a ring support surface and the flow path is also formed in the ring support surface.

2. The substrate support of claim 1, wherein the base and the electrostatic chuck are made of different materials, and wherein the flow path has an opening that is opened to the electrostatic chuck side.

3. The substrate support of claim 2, wherein the base other than the opening of the flow path and the electrostatic chuck are bonded by metal brazing.

4. The substrate support of claim 3, wherein a thickness of a partition wall of the flow path is 2 to 20 mm.

5. The substrate support of claim 4, wherein the heat exchange medium is a liquid.

6. The substrate support of claim 1, wherein the base and the electrostatic chuck are made of different materials, and wherein the flow path is formed at least in the electrostatic chuck and is opened to the base side.

7. The substrate support of claim 6, wherein the flow path is formed at corresponding positions of the electrostatic chuck and the base so as to communicate with each other.

8. The substrate support of claim 6, wherein the base other than an opening of the flow path and the electrostatic chuck are bonded by metal brazing or sintering.

9. The substrate support of claim 6, wherein outer peripheries of the base and the electrostatic chuck are fixed by a clamp.

10. The substrate support of claim 1, wherein the base and the electrostatic chuck are made of a same material and are integrally formed.

11. The substrate support of claim 1, wherein a thickness of a partition wall of the flow path is 2 to 20 mm.

12. The substrate support of claim 1, wherein a thickness of a partition wall of the flow path is 1 to 2 mm.

13. The substrate support of claim 1, wherein the heat exchange medium is a liquid.

14. A substrate processing apparatus comprising:
a chamber; and
a substrate support on which a substrate is placed in the chamber,
wherein the substrate support includes:
an electrostatic chuck formed of ceramics and on which the substrate is placed;
a base supporting the electrostatic chuck; and
a flow path through which a temperature control medium flows, the flow path being formed in the base,
wherein an upper surface of the flow path is formed of ceramics forming the electrostatic chuck, and
wherein the electrostatic chuck includes a ring support surface and the flow path is also formed in the ring support surface.

* * * * *